United States Patent
Ok et al.

(10) Patent No.: US 12,310,263 B2
(45) Date of Patent: May 20, 2025

(54) PHASE CHANGE MEMORY GAPS

(71) Applicant: International Business Machines Corporation, Armonk, NY (US)

(72) Inventors: Injo Ok, Loudonville, NY (US); Soon-Cheon Seo, Glenmont, NY (US); Alexander Reznicek, Troy, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 672 days.

(21) Appl. No.: 17/528,197

(22) Filed: Nov. 17, 2021

(65) Prior Publication Data

US 2023/0157185 A1 May 18, 2023

(51) Int. Cl.
*G11C 16/04* (2006.01)
*H10B 63/00* (2023.01)
*H10N 70/00* (2023.01)
*H10N 70/20* (2023.01)

(52) U.S. Cl.
CPC .......... *H10N 70/231* (2023.02); *H10B 63/00* (2023.02); *H10N 70/021* (2023.02); *H10N 70/841* (2023.02); *H10N 70/8613* (2023.02)

(58) Field of Classification Search
CPC .............. G11C 13/004; G11C 13/0004; G11C 13/0069; G11C 13/0007
See application file for complete search history.

(56) References Cited

U.S. PATENT DOCUMENTS

| | | | |
|---|---|---|---|
| 7,728,319 B2 * | 6/2010 | Goux | H10B 63/32 257/750 |
| 8,106,376 B2 | 1/2012 | Lai | |
| 8,212,231 B2 | 7/2012 | Chen | |
| 8,288,750 B2 | 10/2012 | Shen | |
| 9,136,128 B2 | 9/2015 | Lee | |
| 9,660,188 B2 | 5/2017 | Lin | |
| 10,050,194 B1 | 8/2018 | Nardi | |
| 10,692,991 B2 | 6/2020 | Chanemougame | |

(Continued)

OTHER PUBLICATIONS

Fong et al., "Dual-Layer Dielectric Stack for Thermally Isolated Low-Energy Phase-Change Memory," IEEE Transactions on Electron Devices, vol. 64, No. 11, Nov. 2017, pp. 4496-4502.

(Continued)

*Primary Examiner* — Pho M Luu
(74) *Attorney, Agent, or Firm* — Matthew Zehrer

(57) ABSTRACT

A PCM cell includes a first electrode, a heater/PCM portion electrically connected to first electrode, the heater/PCM portion comprising a PCM material, a second electrode electrically connected to the PCM material, and an electrical insulator stack surrounding the projection liner. The stack includes a plurality of first layers comprised of a first material and having a plurality of first inner sides facing towards the projection liner, and a plurality of second layers alternating with the plurality of first layers, the plurality of second layers comprised of a second material that is different from the first material, and the second plurality of layers having a plurality of second inner sides facing towards the projection liner. The plurality of second inner sides that are offset from the plurality of first inner sides forming a plurality of gaps.

19 Claims, 20 Drawing Sheets

(56) References Cited

U.S. PATENT DOCUMENTS

| | | |
|---|---|---|
| 10,910,470 B1 | 2/2021 | Wu |
| 2009/0003933 A1 | 1/2009 | Anderson |
| 2011/0006279 A1* | 1/2011 | Chen .................. H10N 70/231 |
| | | 257/E45.002 |
| 2011/0300685 A1* | 12/2011 | Horii .................. H10N 70/8265 |
| | | 257/E21.09 |
| 2021/0305503 A1 | 9/2021 | Philip |

OTHER PUBLICATIONS

Fong et al., "Dual-layer Dielectric Stack for Thermally-isolated Low-power Phase-change Memory," 2017 IEEE International Memory Workshop (IMW), May 14-17, 2017, 4 pages.

Fong et al., "Phase-Change Memory—Towards a Storage-Class Memory," IEEE Transactions on Electron Devices, vol. 64, No. 11, Nov. 2017, pp. 4374-4385.

Park et al., "20nm DRAM: A new beginning of another revolution," 2015 IEEE International Electron Devices Meeting (IEDM15), Dec. 7-9, 2015, 4 pages.

Williams et al., "Etch Rates for Micromachining Processing—Part II," Journal of Microelectromechanical Systems, vol. 12, No. 6, Dec. 2003, pp. 761-778.

Bruce R L et al: Mushroom-Type phase change memory with projection liner: An array-level demonstration of conductance drift and noise mitigation.

International Search Report and Written Opinion dated Mar. 6, 2023, for International Application No. PCT/EP2022/080260, filed Oct. 28, 2022.

* cited by examiner

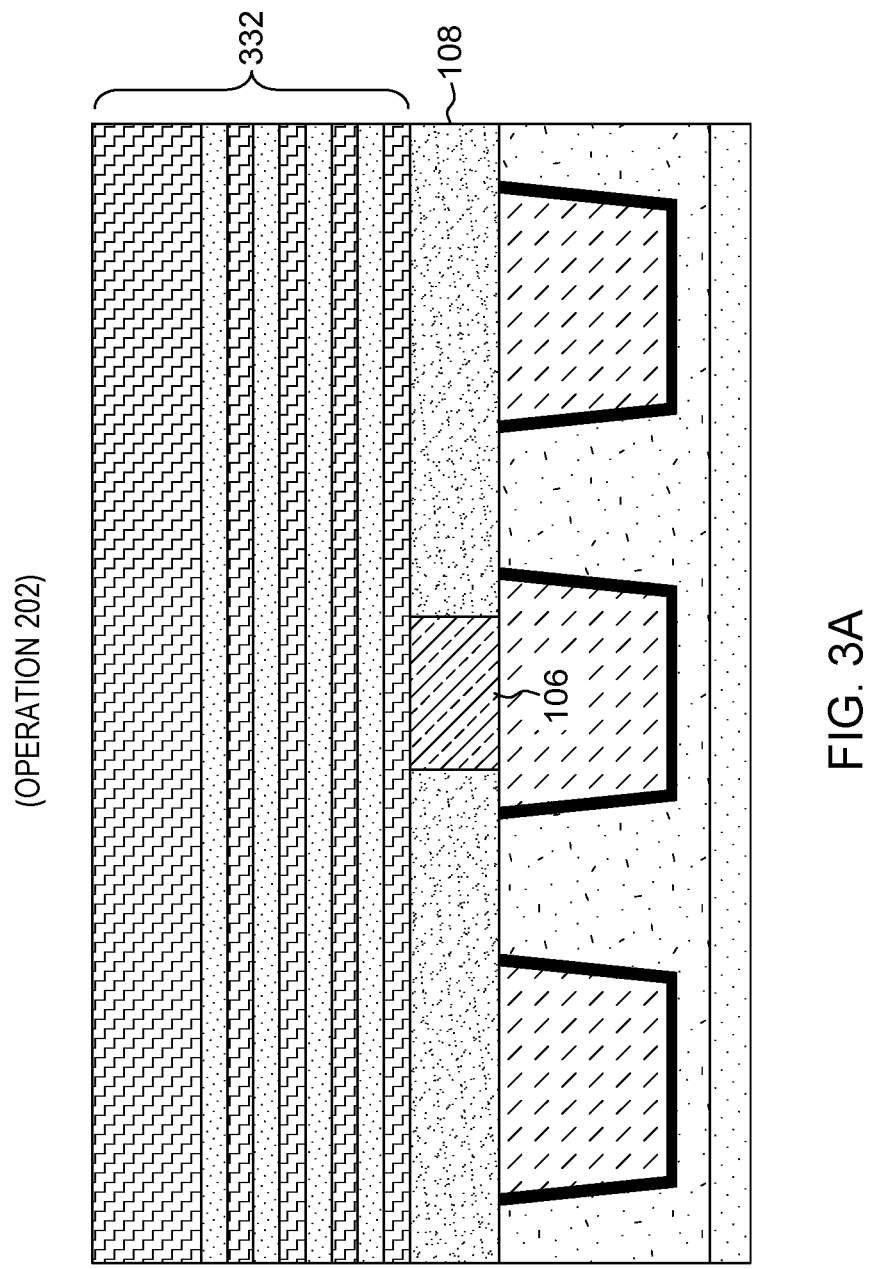

PHASE CHANGE MEMORY GAPS

BACKGROUND

The present invention relates to computer memory, and more specifically, to phase change material memory devices with air gaps.

Phase change memory (PCM) can be utilized for both training and inference in analog computing for artificial intelligence. The PCM structures can include phase change memristive devices with tunable conductivities and overall high device resistance with high retention to minimize energy consumption. The tuning can be accomplished by forming different structural states with varying proportions of crystalline and amorphous phases of PCM material. The formation of these phases can occur by heating the PCM material in varying amounts in a controlled fashion.

SUMMARY

According to an embodiment of the present disclosure, a PCM cell includes a first electrode, a heater/PCM portion electrically connected to first electrode, the heater/PCM portion comprising a PCM material, a second electrode electrically connected to the PCM material, and an electrical insulator stack surrounding the projection liner. The stack includes a plurality of first layers comprised of a first material and having a plurality of first inner sides facing towards the projection liner, and a plurality of second layers alternating with the plurality of first layers, the plurality of second layers comprised of a second material that is different from the first material, and the second plurality of layers having a plurality of second inner sides facing towards the projection liner. The plurality of second inner sides that are offset from the plurality of first inner sides forming a plurality of gaps.

According to an embodiment of the present disclosure, a method of manufacturing a PCM cell includes forming a first electrode and forming an electrical insulator stack on the first electrode. The stack includes a plurality of first layers comprised of a first material, and a plurality of second layers alternating with the plurality of first layers, the plurality of second layers comprised of a second material that is different from the first material. The method also includes forming a via in the stack, removing portions of the plurality of second layers from the via while leaving the plurality of first layers intact, forming a wall in the via on the plurality of first layers, which creates a plurality of gaps, forming a heater/PCM portion inside the wall, and forming a second electrode on the heater/PCM portion.

According to an embodiment of the present disclosure, a PCM cell includes a first electrode, a heater/PCM portion electrically connected to first electrode, the heater/PCM portion comprising a PCM material, a second electrode electrically connected to the PCM material, and an electrical insulator stack surrounding the projection liner, the stack defining a plurality of gaps. Each of the gaps has a toroidal shape, is axially spaced apart from each other from one or more other gaps, and surrounds a portion of the PCM material.

BRIEF DESCRIPTION OF THE DRAWINGS

FIGS. 3A-3I are a series of cross-section views of the method of FIG. 2 of manufacturing the PCM cell, in accordance with an embodiment of the present disclosure.

DETAILED DESCRIPTION

Figure 1A:
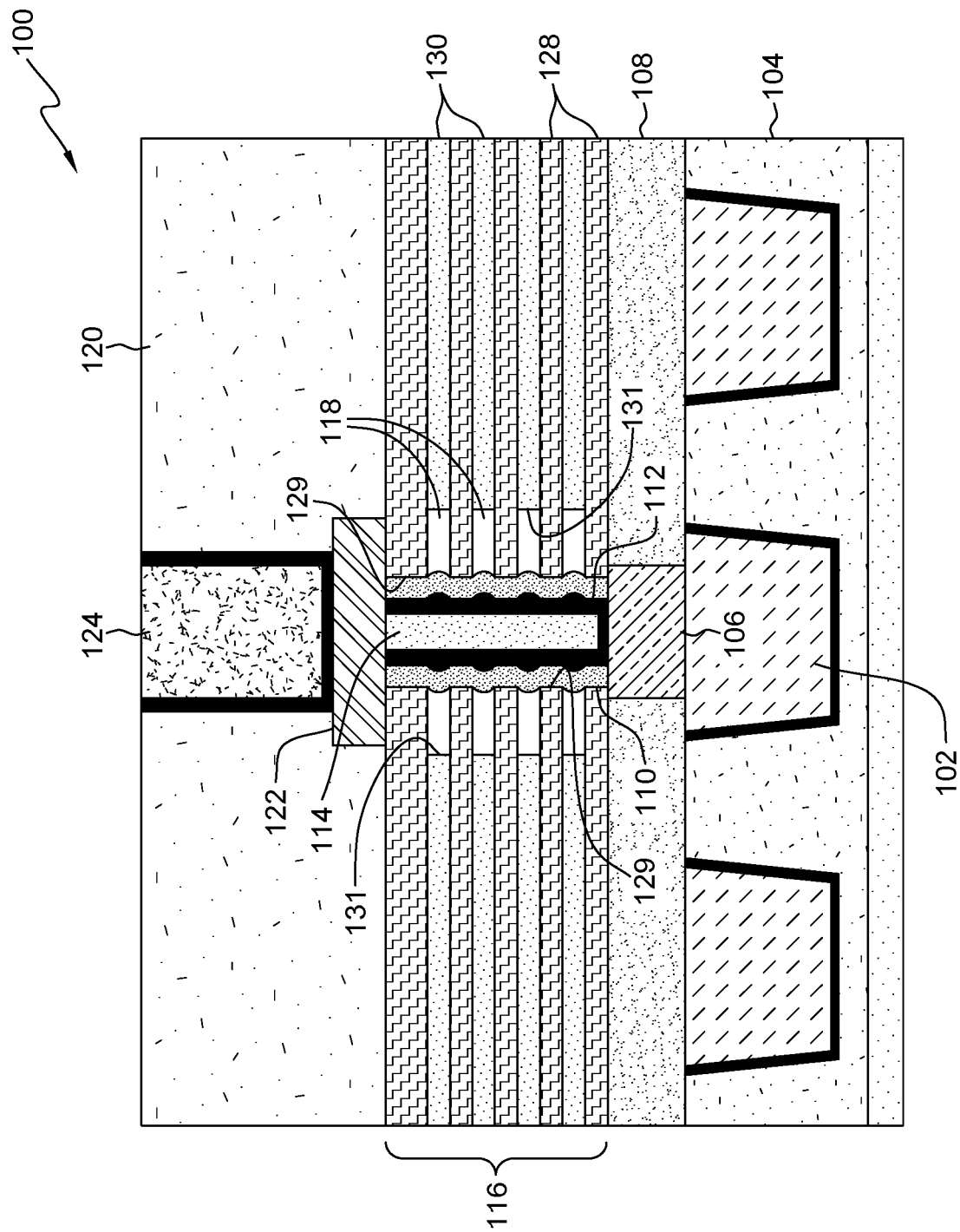
FIG. 1A is a cross-section view of a PCM cell including air gaps, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Figure 1B:
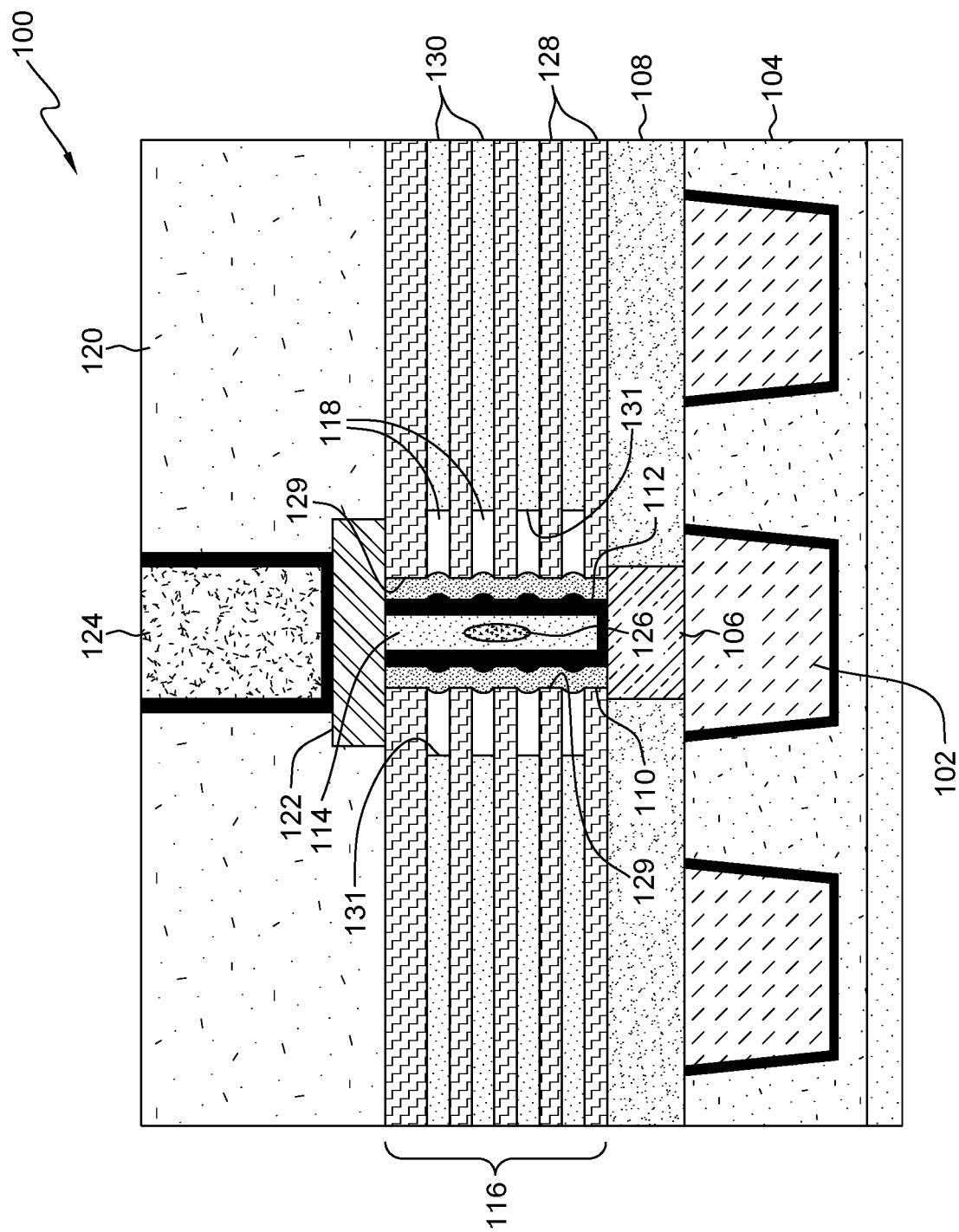
FIG. 1B is a cross-section view of the PCM cell of FIG. 1A including an amorphous zone, in accordance with an embodiment of the present disclosure.

FIGS. 1A and 1B are cross-section views of PCM cell 100 for use in, for example, an integrated circuit (not shown). In the illustrated embodiment, PCM cell 100 comprises bottom wire 102, insulator 104, bottom electrode 106, insulator 108, wall 110, projection liner 112, PCM material 114, stack 116, gaps 118, insulator 120, top electrode 122, and top wire 124.

In the illustrated embodiment, the bottom of bottom electrode 106 is in direct contact with and electrically connected to the top of bottom wire 102, which can receive electrical signals from other components (not shown) of the integrated circuit. The bottom of projection liner 112 is in direct contact with and electrically connected to the top of bottom electrode 106. The bottom and side of PCM material 114 is in direct contact with and electrically and thermally connected to the inner surface of projection liner 112. The bottom of top electrode 122 is in direct contact with and electrically connected to the top of PCM material 114. The bottom of top wire 124 is in direct contact with and electrically connected to the top of top electrode 122, and top wire 124 can deliver electrical signals from PCM cell 100 to other components (not shown) of the integrated circuit.

In the illustrated embodiment, wall 110 is in direct contact with and laterally surrounds the outer sides of projection liner 112. As such, wall 110 encloses projection liner 112 on all parallel sides in at least one direction (e.g., the sides that extend vertically, as shown in FIG. 1A). Stack 116 generally laterally surrounds and is selectively in direct contact with the outer sides of wall 110. More specifically, stack 116 is an electrical insulator that has a bi-layer configuration comprising alternating A layers 128 and B layers 130. While inner sides 129 of A layers 128 are in direct contact with wall 110 and laterally surround the corresponding axial sections thereof, inner sides 131 of B layers 130 are laterally spaced apart from wall 110. This forms a series of axially spaced, toroidal gaps 118 that each surround a portion of wall 110, projection liner 112, and PCM material 114, wherein each gap 118 is bounded by two A layers 128, a B layer, and wall 110. Because gaps 118 are voids in stack 116, no solid material contacts the outer sides of wall 110 at gaps 118. The bottom and top of stack 116 are formed by two A layers 128, which are directly in contact with insulator 108, bottom electrode 106, insulator 120, and top electrode 122, respectively. Top electrode 122 is also in direct contact with and surrounded by insulator 120 laterally on its outer side and axially on a portion of its top side, and the outer sides of top wire 124 are in direct contact with and laterally surrounded by insulator 120.

While there are nine layers shown in FIG. 1A (i.e., five A layers 128 and four B layers 130), there can be fewer (e.g., three) or greater (e.g., twenty-one). In addition, A layers 128 and B layers 130 can be, for example, between 2 nanometers (nm) and 20 nm thick. Furthermore, the thickness of A layers 128 can be the same as or different from the thickness of B layers 130.

In the illustrated embodiment, A layers 128 and B layers 130 are comprised of a dielectric (electrical insulating) material, such as, for example, NBLoK, silicon nitride (SiN), aluminum oxide ($Al_2O_3$), aluminum nitride (AlN), silicon oxide ($SiO_2$), or silicon oxycarbide ($SiO_XC_Y$). A layers 128 and B layers 130 are comprised of different materials such that portions of B layers 130 can be selectively removed without removing a significant amount of A layers 128 (thereby forming gaps 118). For example, A layers 128 can be comprised of SiN and B layers 130 can be comprised of AlN. The difference in the materials of A layers 128 and B layers 130 can be utilized during the manufacturing of PCM cell 100. For example, there is significant selectivity with respect to the removal of AlN and the removal of SiN by some reactants and/or processes, with a ratio of etching rates (i.e., AlN:SiN or SiN:AlN), for example, of 5:1, 10:1, or greater. More specifically, SiN is susceptible to being removed using a RIE process, whereas AlN is resistant to an RIE process, so SiN can be removed without substantially removing AlN. On the other hand, AlN is susceptible to being removed using certain wet etching processes and chemicals, whereas SiN is resistant to such processes, so AlN can be removed without substantially removing SiN. For another example, A layers 128 can be comprised of $SiO_2$ and B layers 130 can be comprised $Al_2O_3$. $Al_2O_3$ has a higher selectivity with chlorine gas ($Cl_2$), argon (Ar), and an argon-boron-chlorine ($Ar/B/Cl_2$) mixture. Furthermore, the $SiO_2$ and SiN etching rates are related to carbon tetrafluoride ($CF_4$) and oxygen ($O_2$), while the $Al_2O_3$ etching rate is related to aluminum chloride ($AlCl_3$) or a chlorine-boron trichloride ($Cl_2/BCl_3$) mixture. Therefore, gasses such as fluorine (F), $Cl_2$, sulfur hexafluoride ($SF_6$), fluorocarbon ($C_xF_y$), Ar, hydrogen ($H_2$), etc. can provide RIE selectivity between $Al_2O_3$ and SiN or $SiO_2$.

In the illustrated embodiment, insulators 104, 108, 120 and stack 116 structurally support and electrically isolate the other components of PCM cell 100, selectively, and fill in the space therebetween, as appropriate. Thus, the outer side of bottom wire 102 is in direct contact with and laterally surrounded by insulator 104, and the outer side of bottom electrode 106 is in direct contact with and laterally surrounded by insulator 108. Furthermore, the top side of stack 116, the outer side and part of the top side of top electrode 122, and the outer side of top wire 124 are in direct contact with insulator 120.

In the illustrated embodiment, a cross-section of various components and/or the entirety of PCM cell 100 (into the page in FIG. 1) can be circular, although in other embodiments, it can be rectangular, square, oval, or any other suitable shape. In addition, the width of PCM material 114 is smaller than the widths of bottom electrode 106 and top electrode 122, whereas the axial length of PCM material 114 is substantially longer than its width. Thereby, PCM cell 100 can be said to have a confined cell configuration wherein an electrical signal (i.e., electrical current) can flow from bottom electrode 106 to top electrode 122 through projection liner 112 and PCM material 114. In some embodiments, PCM material 114 can be between 20 nm and 50 nm wide and between 30 nm and 100 nm thick (i.e., tall).

In the illustrated embodiment, bottom electrode 106 and top electrode 122 are comprised of a very electrically conductive material, such as metal or metallic compound, for example, titanium nitride (TiN) or tungsten (W). Wall 110 has a high electrical resistance component that is comprised of a dielectric (e.g., SiN) or a higher resistance metal, such as, for example, tantalum nitride (TaN). Wall 110 can have a thickness in the range of, for example, 5 nm to 50 nm. In addition, projection liner 112 is comprised of a higher resistance metal, such as, for example, TaN. Projection liner 112 can have a thickness in the range of, for example, 2 nm to 10 nm.

In the illustrated embodiment, insulators 104, 108, 120 are comprised of a dielectric (electrical insulating) material, such as, for example, SiN, Sift, silicon nitride carbide (SiNC), or tetraethyl orthosilicate (TEOS). In some embodiments, all of the insulators 104, 108, 120 are the same material, and in other embodiments, different materials are used for some or all of insulators 104, 108, 120. In some embodiments, insulator 108 (and bottom electrode 106) has a thickness in the range of 10 nm to 100 nm.

In the illustrated embodiment, PCM material 114 is composed essentially of a phase change material such as a germanium-antimony-tellurium (GST), gallium-antimony-tellurium (GaST), or silver-iridium-antimony-telluride (AIST) material, although other materials can be used as appropriate. Examples of other PCM materials can include, but are not limited to, germanium-tellurium compound material (GeTe), silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, Ge—Te alloys and combinations thereof. PCM material 114 may be undoped or doped (e.g., doped with one or more of oxygen (O), nitrogen (N), silicon (Si), or titanium (Ti). The terms "composed essentially" and "consist essentially," as used herein with respect to materials of different layers, indicates that other materials, if present, do not materially alter the basic characteristics of the recited materials. For example, a PCM material 114 consisting essentially of GST material does not include other materials that materially alter the basic characteristics of the GST material.

In the illustrated embodiment, PCM cell 100 can be operated as a memory cell by passing an electrical current pulse from bottom electrode 106 to top electrode 122 to program PCM cell 100. This can be done at a variety of voltages and/or for a variety of durations to read or write a value on PCM cell 100. For example, to write, a high voltage can be used (e.g., 1 volt (V) to 4 V) for a short duration, which can cause PCM material 114 to heat itself (via resistive heating) beyond its melting point. Thereby, PCM material 114 serves the function of heater as well as of memory. Once the flow of current ceases, PCM material 114 can cool down rapidly, which forms amorphous zone 126 in a process called "resetting". Amorphous zone 126 is a dome-shaped region of PCM material 114 having an amorphous configuration, although the remainder of PCM material 114 is still in a polycrystalline configuration. In general, this amorphous configuration has no definite structure. However, there can be local, disjoint crystalline nuclei (i.e., small, crystallized regions of phase change material 114) present in amorphous zone 126. The creation of amorphous zone 126 can cause the electrical resistance across PCM cell 100 to increase as compared to a solely polycrystalline configuration (a la PCM cell 100 in FIG. 1A). These resistance values of PCM cell 100 can be read without changing the state of PCM material 114 (including that of amorphous zone 126) or the resistance value of PCM cell 100, for example, by sending a current pulse at a low voltage (e.g., 0.2 V) from bottom electrode 106 to top electrode 122.

In addition, PCM material 114 can be rewritten and returned back to a solely polycrystalline configuration by "setting" PCM cell 100. One way to set PCM material 114 uses a high voltage electrical pulse (e.g., 1 V to 4 V) for a short period of time (e.g., 10 nanoseconds (ns)), which can cause PCM material 114 to heat up beyond its crystallization point but not to its melting point. Since the crystallization temperature is lower than the melting temperature, once the flow of current ceases, PCM material 114 can anneal and form crystals. Another way to set PCM material 114 uses an electrical pulse with a relatively long trailing edge (e.g., 1 microsecond) (as opposed to a square pulse with a relatively short trailing edge on the order of nanoseconds) that is strong enough to heat PCM material 114 beyond its melting point, after which, PCM material 114 is cooled down slowly, allowing crystals to form. Either of these processes cause the electrical resistance across a solely polycrystalline PCM cell 100 to decrease as compared to a PCM cell 100 having an amorphous zone 126 (a la PCM cell 100 in FIG. 1B). This new resistance value can then be read using current at a low voltage (e.g., 0.2 V) without changing the state of PCM material 114 or the resistance value of PCM cell 100.

In some embodiments, the melting temperature of PCM material 114 is about 600° C. In some embodiments, the crystallization temperature of PCM material 114 is about 180° C. In addition, the process of setting and resetting PCM cell 100 can occur repeatedly, and in some embodiments, different amorphous zones 126 with different resistances can be created in PCM materials 114 (e.g., due to having different sizes of amorphous zone 126 and/or amounts of crystallization nuclei in amorphous zone 126). This allows for PCM cell 100 to have various distinct resistances that can be created by varying the resetting parameters. Thereby, if PCM cell 100 is considered to represent information digits, these digits can be non-binary (as opposed to traditional bits). However, in some embodiments, PCM cell 100 can be used as a bit by either having or not having a uniform amorphous zone 126 in PCM material 114. In such embodiments, PCM cells 100 can have a high resistance (a.k.a., low voltage output or "0") or low resistance (a.k.a., high voltage output or "1").

The components and configuration of PCM cell 100 allows for gaps 118 to reduce heat conduction away from PCM material 114. This is because gaps 118 have lower thermal conductivity than B layers 130 would. This allows for more of the heat generated in PCM material 114 to stay in PCM material 114, which increases the speed and efficiency of PCM cell 100 and lowers the amount of energy required to tune/program PCM cell 100. Furthermore, the degradation of the performance PCM cell 100 is also reduced, and bottom wire 102 and top wire 124 are heated less than they would be without gaps 118. In addition, projection liner 112 thermally insulates bottom electrode 106 from PCM material 114, further increasing the efficiency of PCM cell 100.

Figure 2:
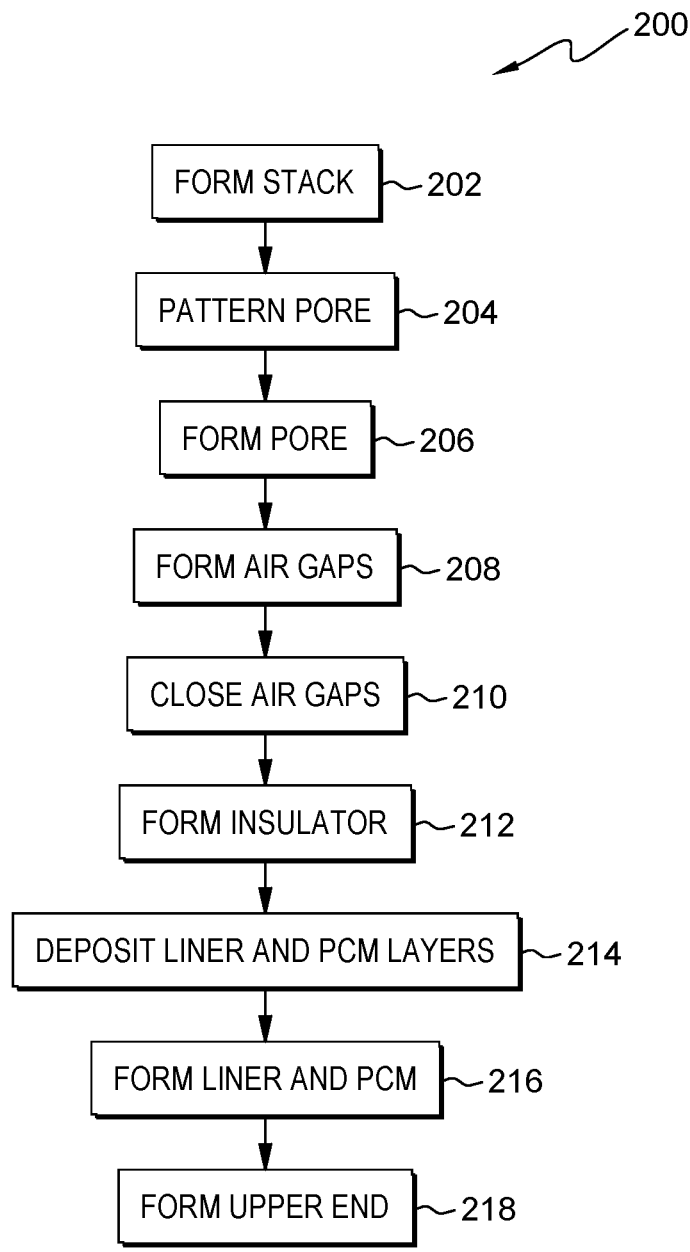
FIG. 2 is a flowchart of a method of manufacturing the PCM cell of FIG. 1A, in accordance with an embodiment of the present disclosure.

FIG. 2 is a flowchart of method 200 of manufacturing PCM cell 100. FIGS. 3A-3I are a series of views of method 200 of manufacturing PCM cell 100. FIGS. 2 and 3A-3I will now be discussed in conjunction with one another wherein each operation of method 200 is illustrated by one of FIGS. 3A-3I. In addition, during this discussion, references may be made to features of PCM cell 100 shown in FIGS. 1A and/or 1B.

In the illustrated embodiment, method 200 starts at operation 202, wherein bi-layer dielectric block 332 is formed on bottom electrode 106 and insulator 108. At operation 204, mask 334 is formed on block 332. Mask 334 is comprised of organic planarization layer (OPL) 336, silicon with anti-reflective coating (SiARC) 338, and photoresist layer 340. Photoresist layer 340 includes gap 342 for formation of via 344 during operation 206. More specifically, via 344 has, for example, a width of 20 nm, which is smaller than the width of bottom electrode 106. Via 344 is formed by etching each layer of block 332 equally, after which mask 334 is removed.

At operation 208, block 332 is selectively etched, for example, using a wet or RIE process to remove portions of one type of the bi-layer dielectric material in via 344 while leaving the other type of the bi-layer dielectric material intact. Thereby, at operation 208, pore 346 is formed, as is stack 116 (having A layers 128 and B layers 130), wherein inner sides 131 of B layers 130 are offset from inner sides 129 of A layers 128. At operation 210, TaN layer 348 is formed on stack 116 using a CVD or PVD process. Thereby, TaN layer 348 conforms to the interior edges of A layers 128, avoiding contact with B layers 130 and separating pore 346 into cavity 350 and gaps 118. The forming of gaps 118 occurs under the condition of the CVD or PVD process, during which a vacuum is present. This vacuum can be, for example, at a pressure of 10 millitorr (mTorr) or less, which leaves some fluid (e.g., air) sealed in gaps 118. In some embodiments, an ALD process is used at operation 210 instead of CVD or PVD. However, if ALD is used, the resulting TaN layer 348 may intrude farther into pore 346, toward B layers 130, resulting in smaller gaps 118. This can reduce the thermal insulating properties of stack 116 since air has a lower thermal conductivity than a dielectric material.

At operation 212, TaN layer 348 is etched, for example, using an RIE process to remove its horizontal portions, thereby exposing bottom electrode 106 and stack 116, as well as forming wall 110. At operation 214, projection layer 352 and PCM layer 354 are deposited inside wall 110. More specifically, projection layer 352 is formed on stack 116, wall 110, and bottom electrode 106, and PCM layer 354 is formed on projection layer 352. At operation 216, chemical mechanical polishing (CMP) is performed to remove the excess material from projection layer 352 and PCM layer 354 to form projection liner 112 and PCM material 114, respectively, which are coterminous with stack 116. At operation 218, insulator 120, top electrode 122, and top wire 124 are formed on stack 116, wall 110, projection liner 112, and PCM material 114, respectively.

The components, configuration, and operation of PCM cell 100 and method 200 allow for gaps 118 to be formed around PCM material 114. This can occur because B layers 130 are susceptible to at least one material removal processes that A layers 128 are resistant to.

Figure 4:
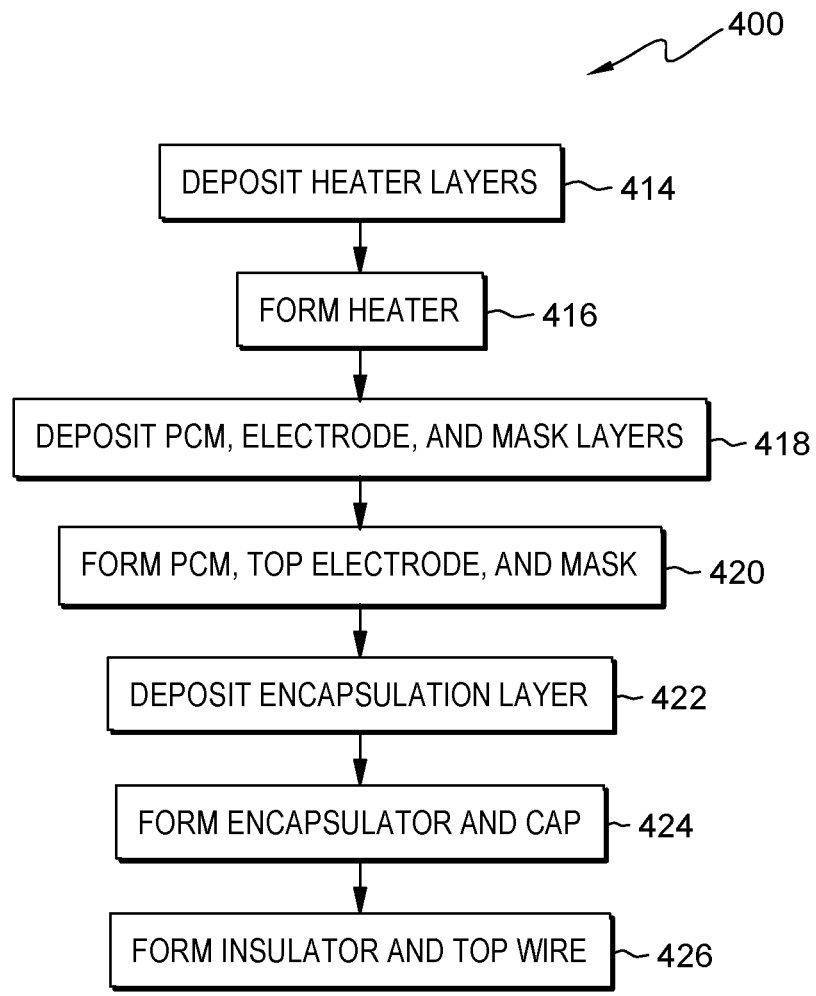
FIG. 4 is a flowchart of an alternative method of manufacturing an alternative PCM cell, in accordance with an embodiment of the present disclosure.
Figure 5A:
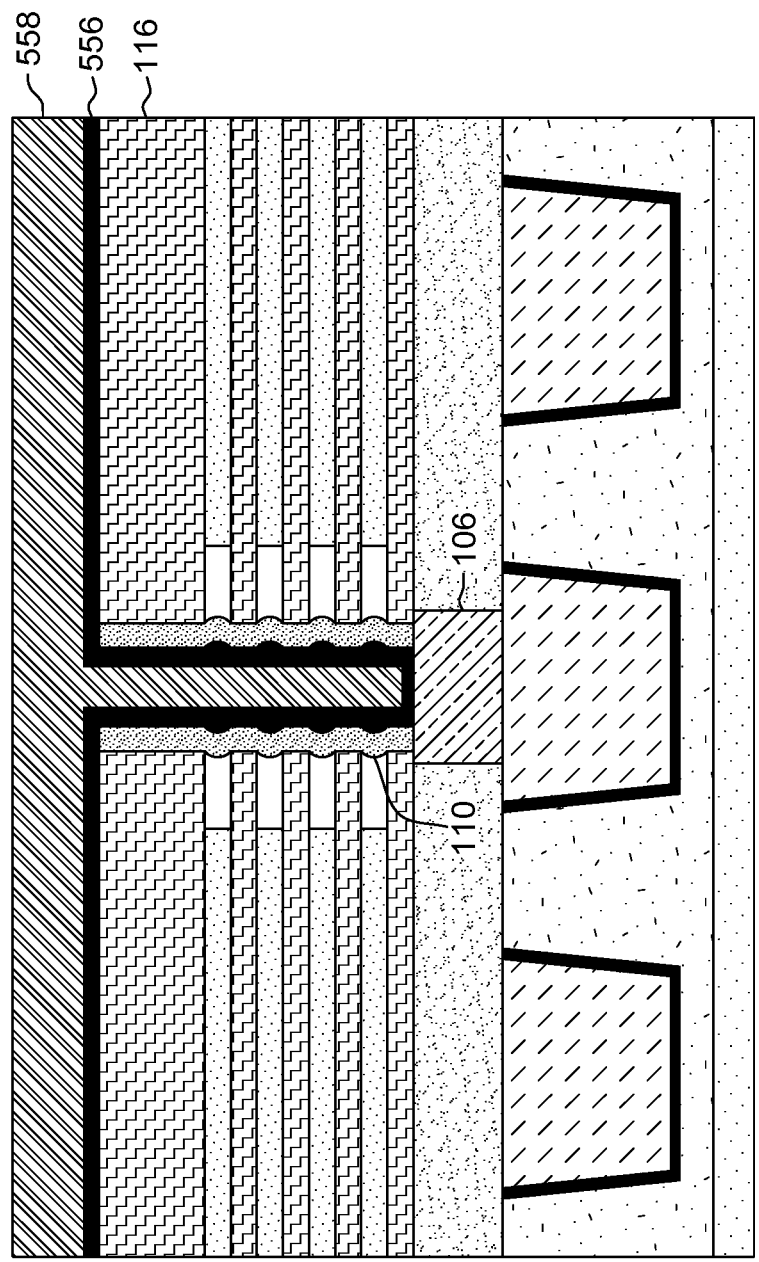
FIGS. 5A-5G are a series of cross-section views of the alternative method of FIG. 4 of manufacturing the alternative PCM cell, in accordance with an embodiment of the present disclosure.
Figure 5B:
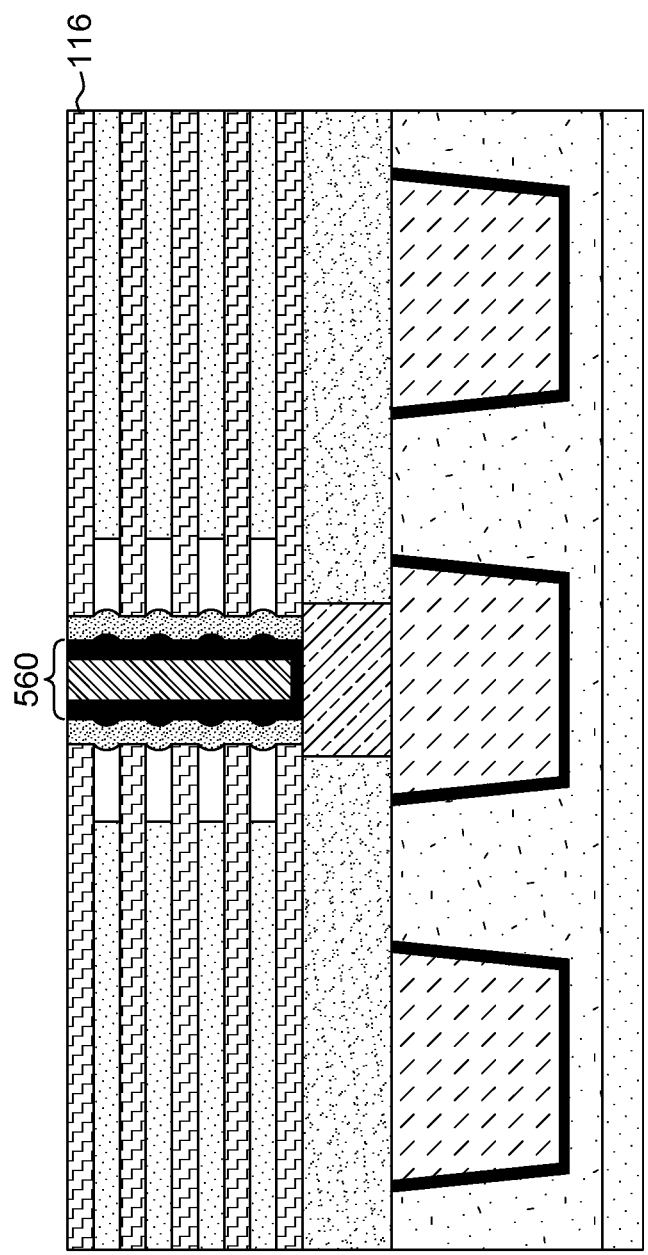
Figure 5C:
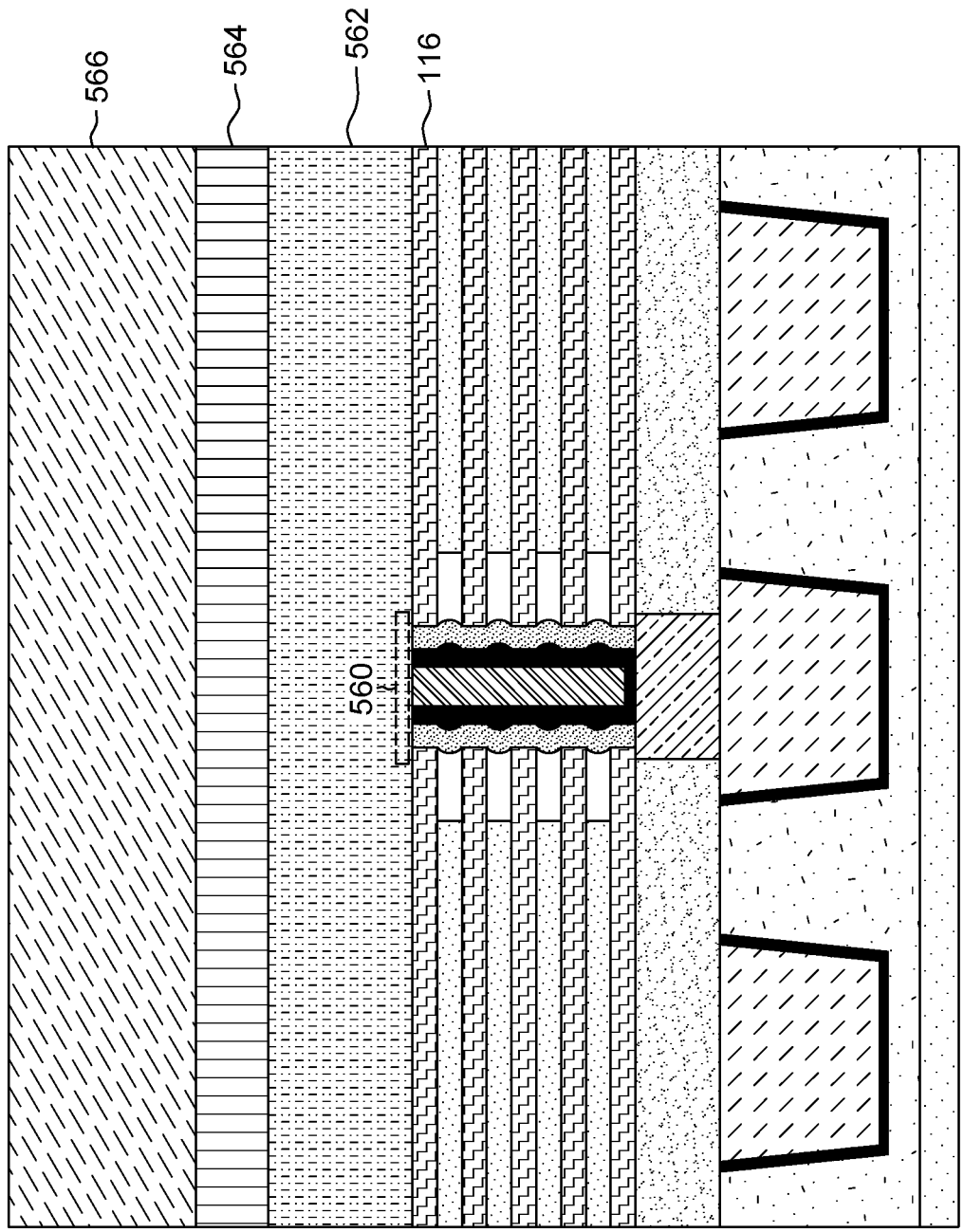
Figure 5D:
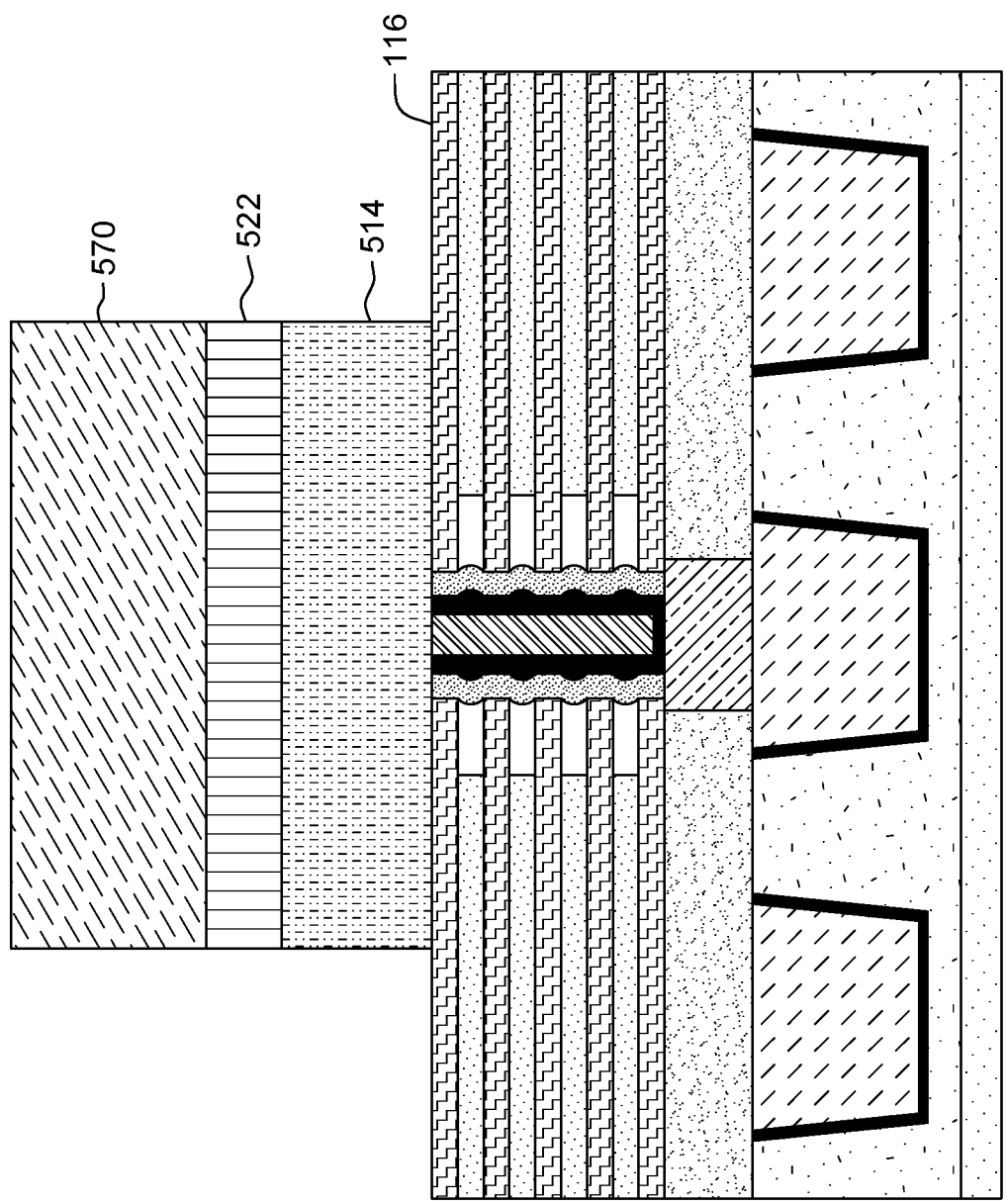
Figure 5E:
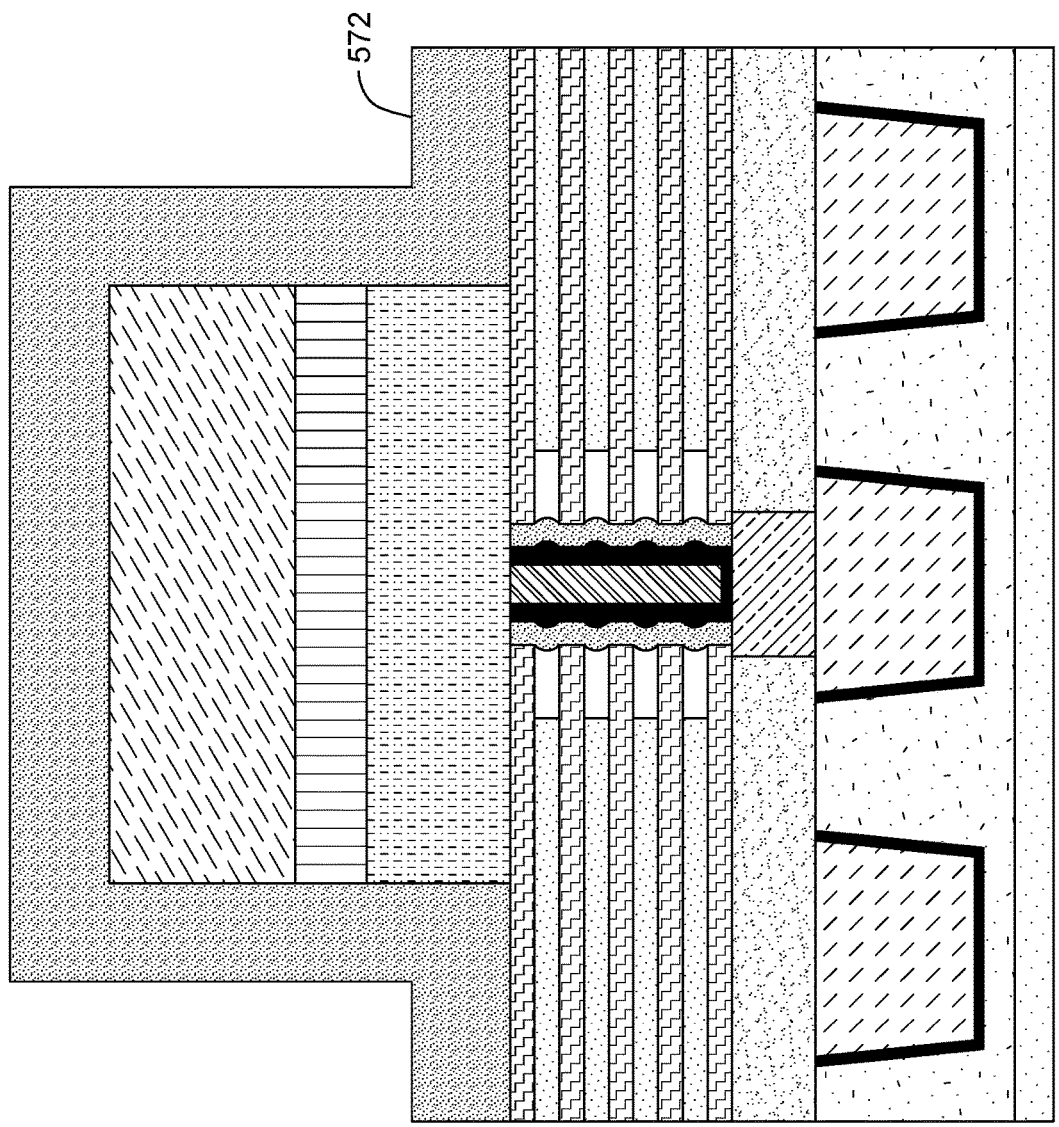
Figure 5F:
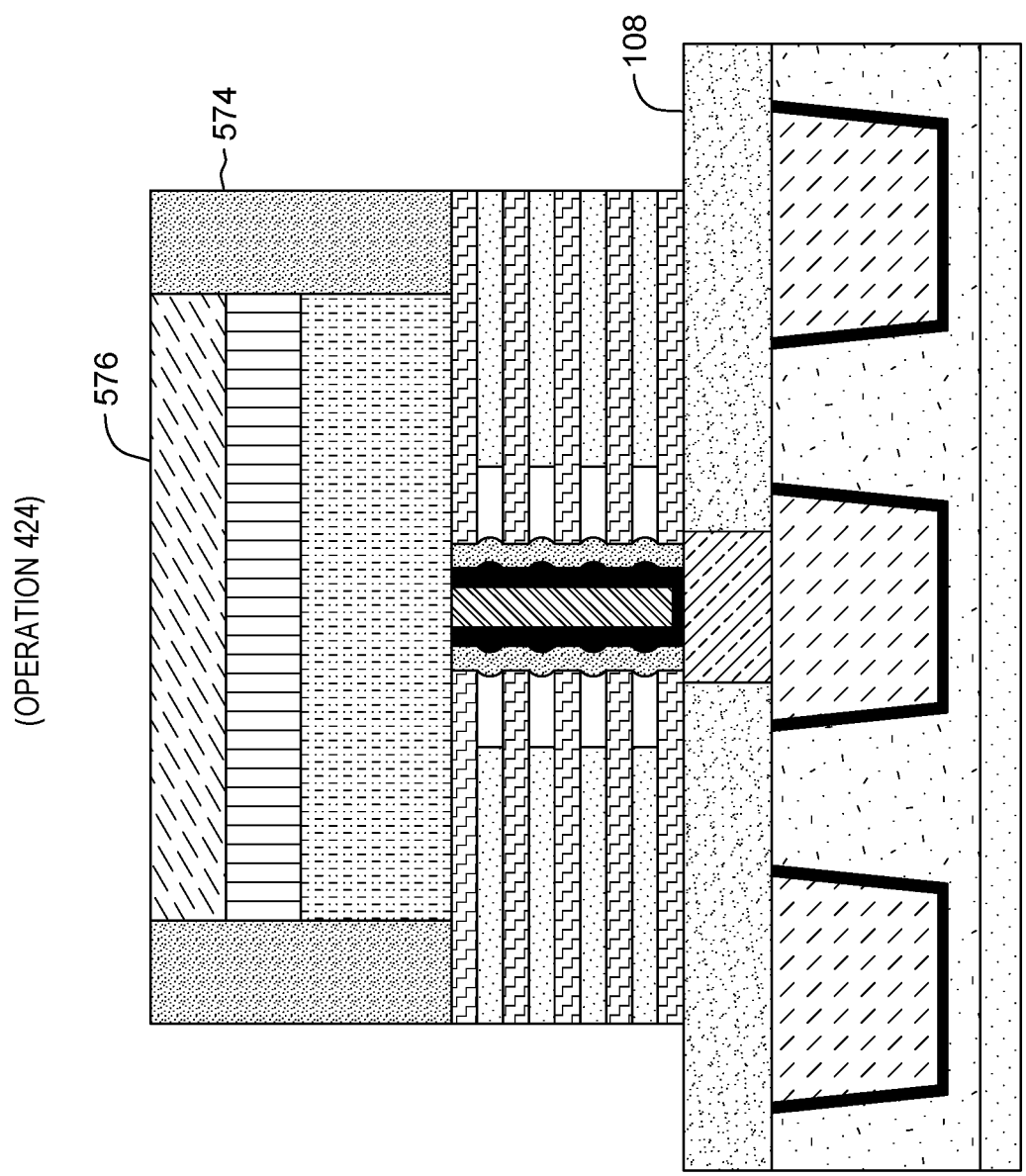
Figure 5G:
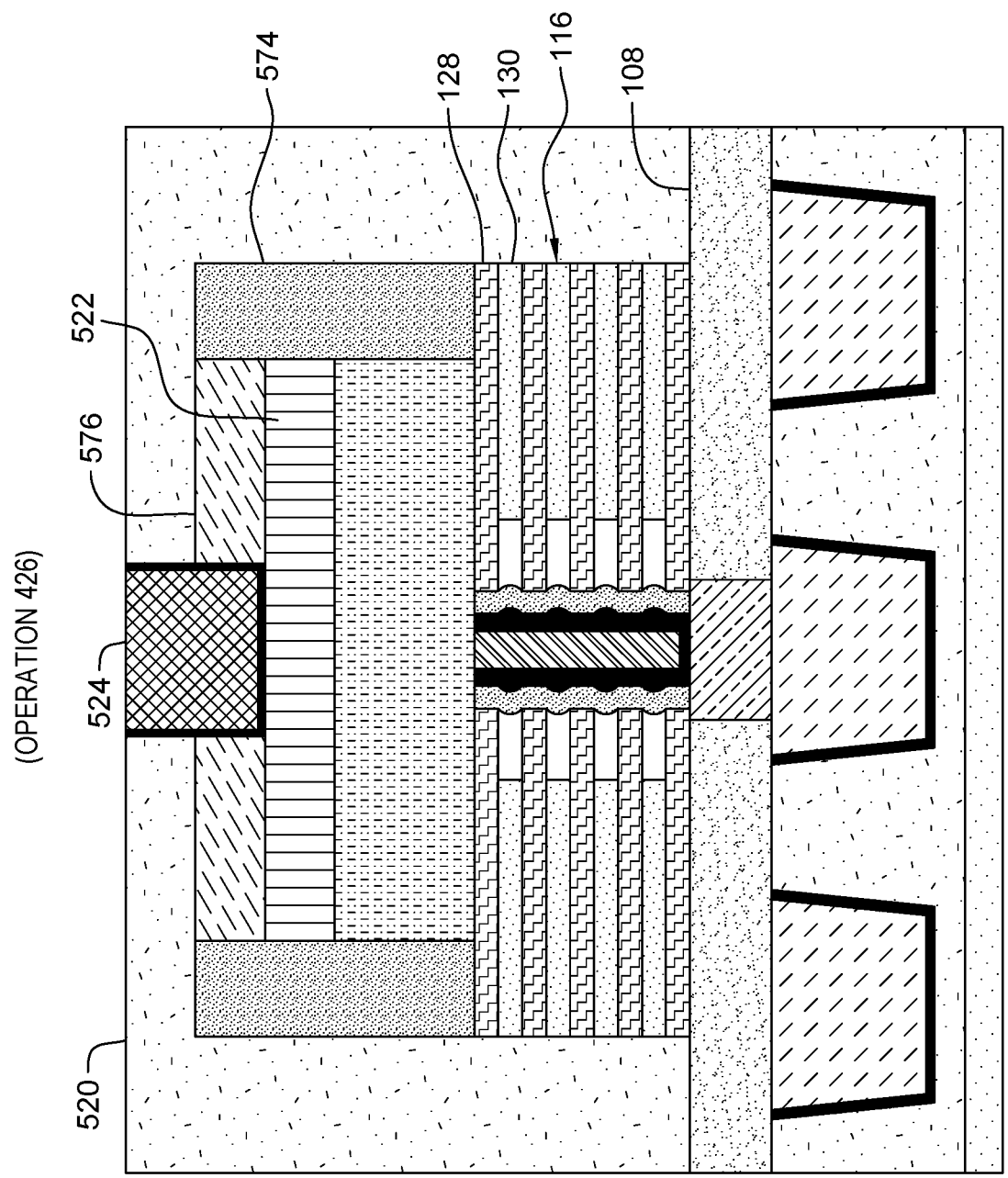

FIG. 4 is a flowchart of method 400 of manufacturing PCM cell 500. FIGS. 5A-5G are a series of cross-section views of method 400 of manufacturing PCM cell 500. FIGS. 4 and 5A-5G will now be discussed in conjunction with one another wherein each operation of method 400 is illustrated by one of FIGS. 5A-5G. During this discussion, references may be made to features of PCM cell 100 (shown in FIG. 1) and PCM cell 500 (shown in FIG. 5G). Features that are the same in PCM cell 500 as PCM cell 100 may have the same reference numerals, and features that are similar in PCM cell 500 to those of PCM cell 100 may have reference numerals that are 400 higher.

Figure 3B:
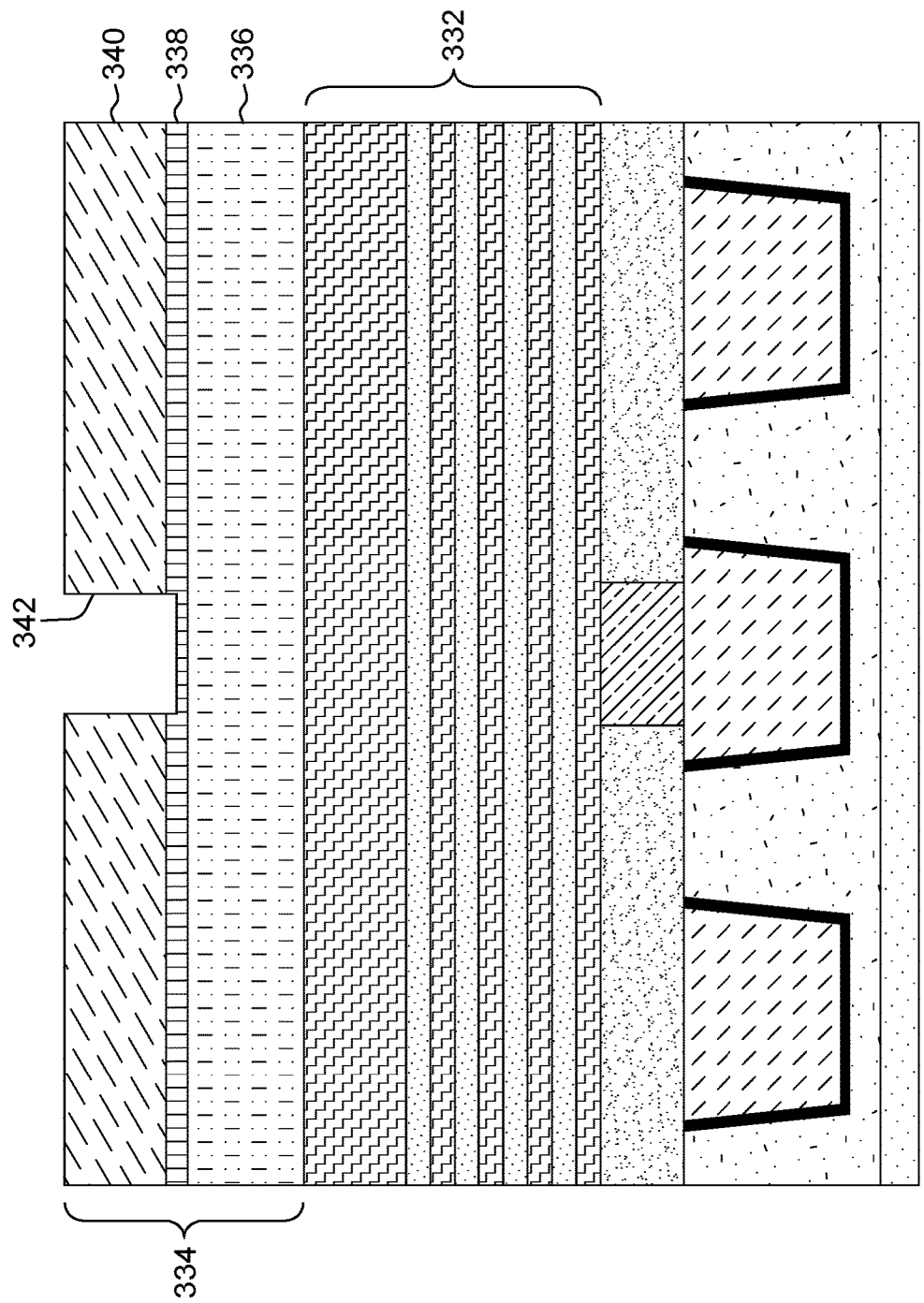
Figure 3C:
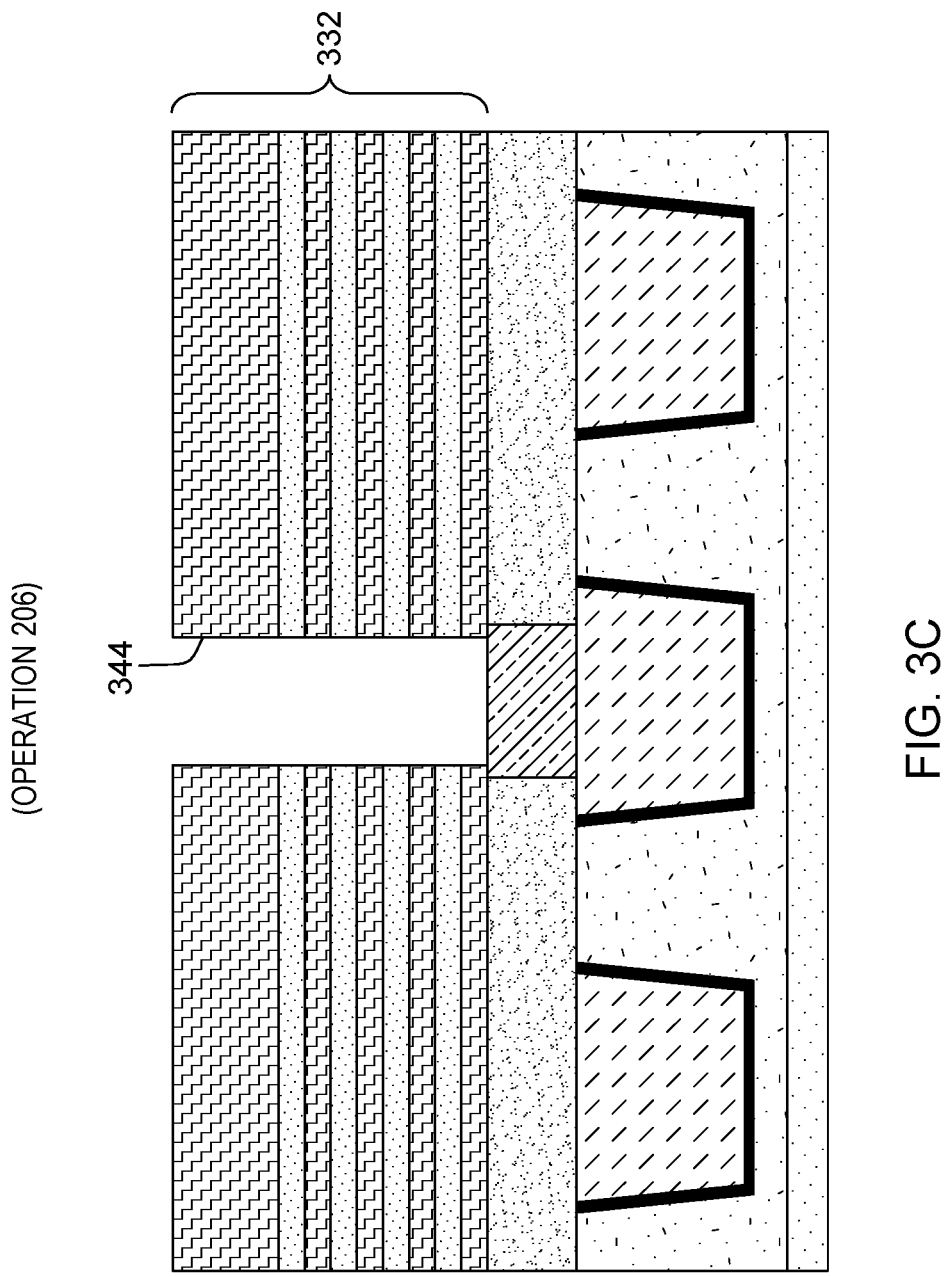
Figure 3D:
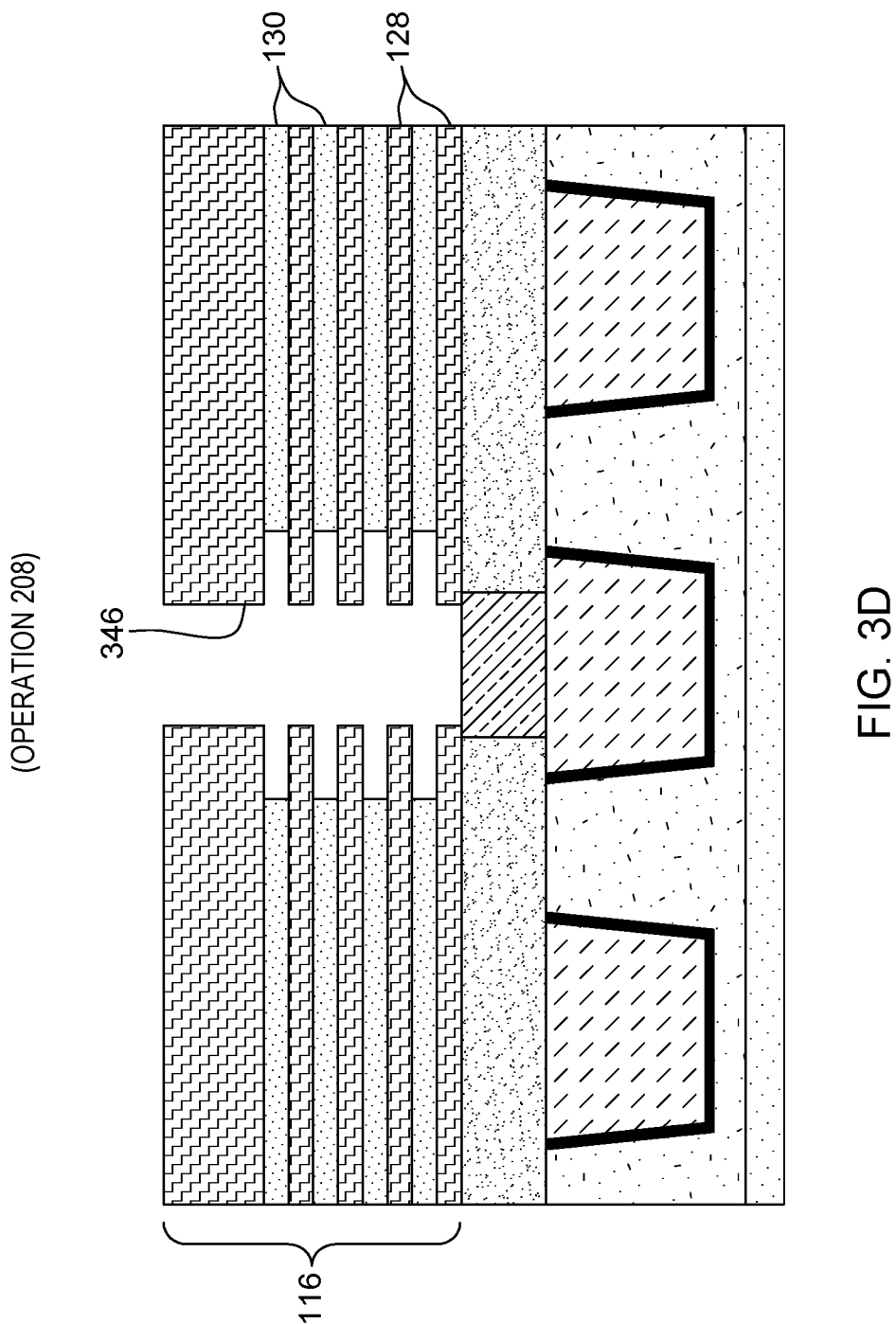
Figure 3E:
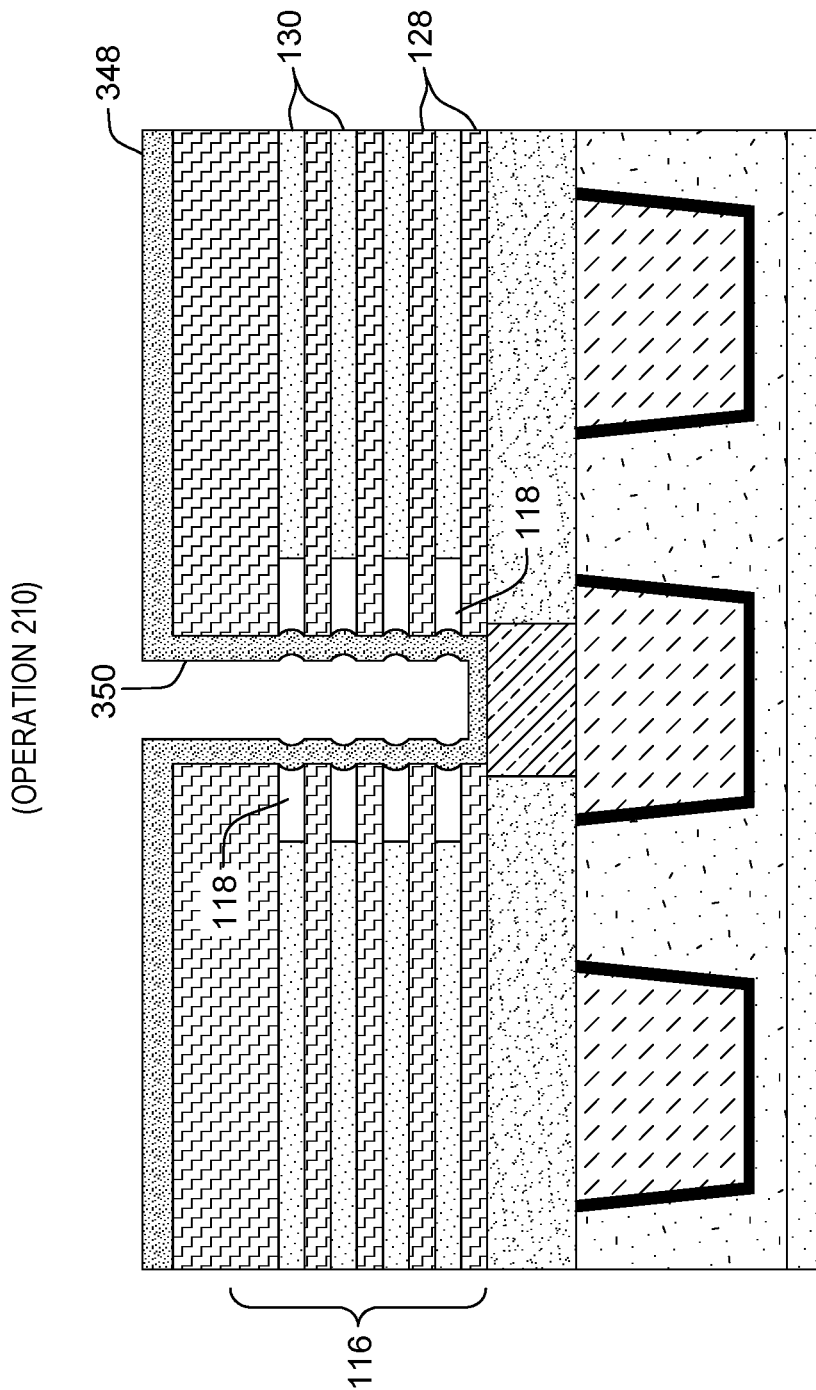
Figure 3F:
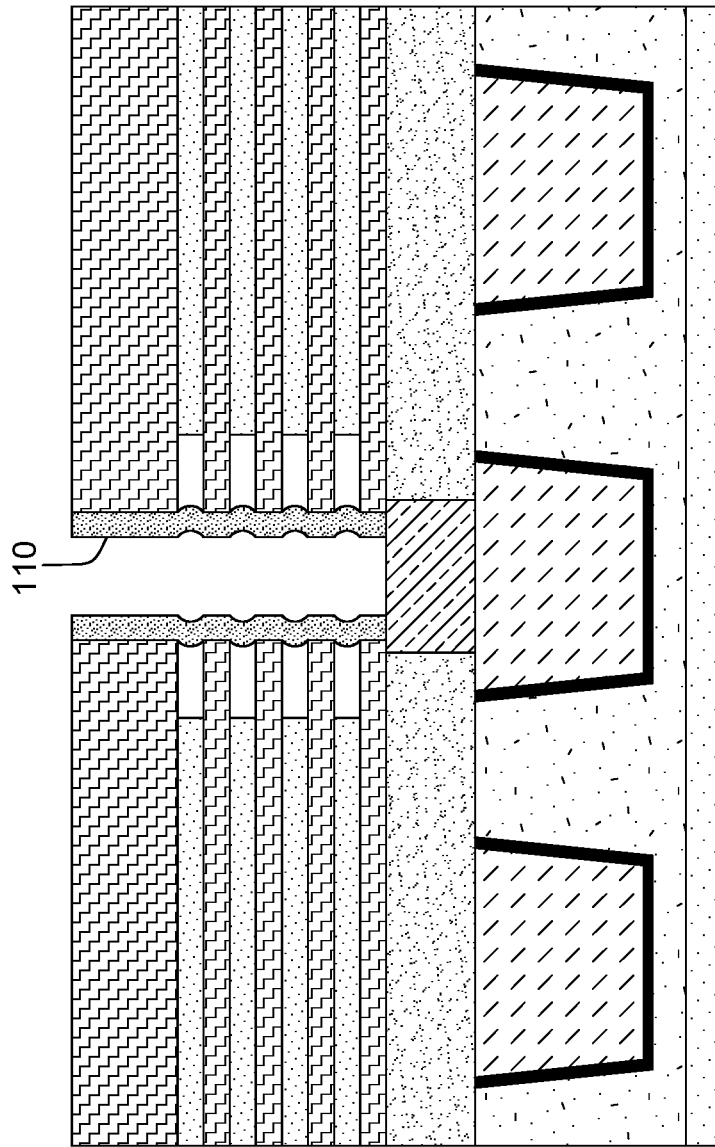
Figure 3G:
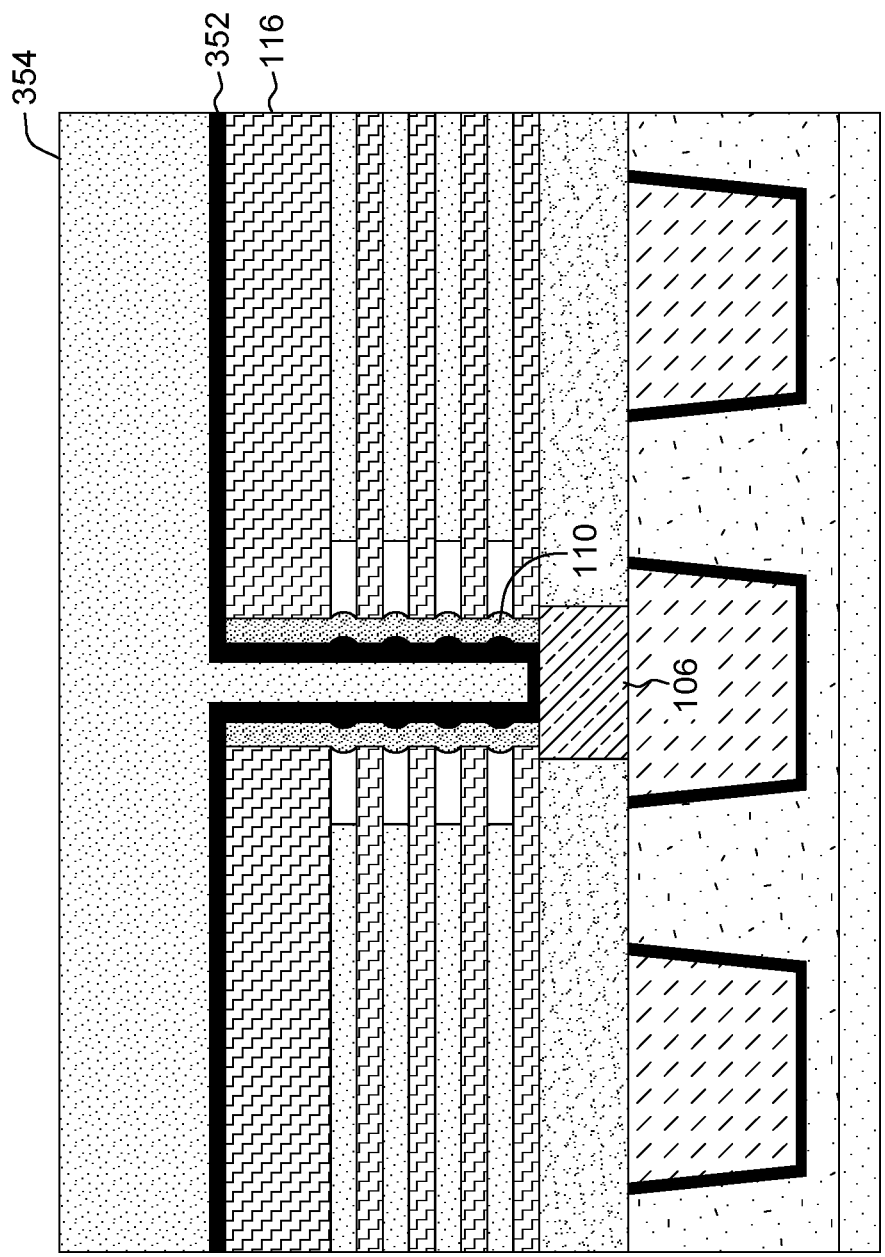
Figure 3H:
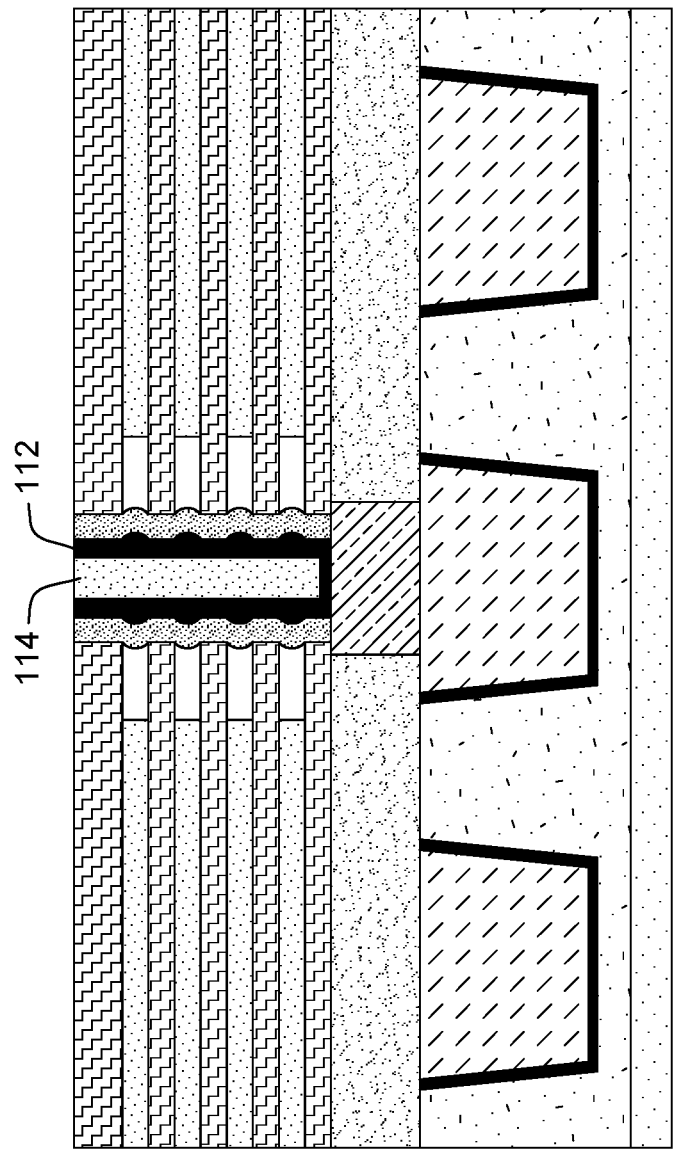
Figure 3I:
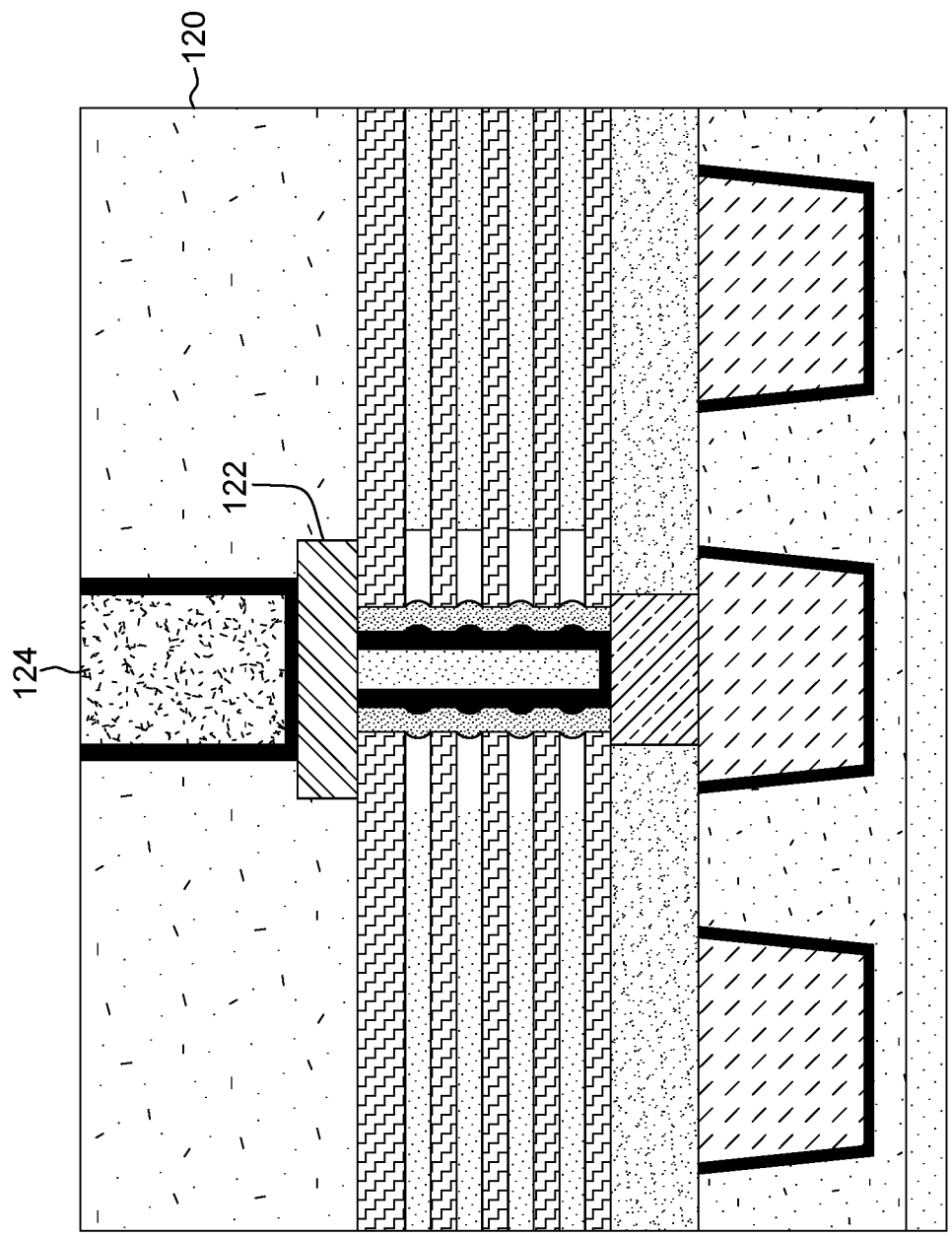

In some embodiments, method 400 begins at operation 210 of method 200 (shown in FIG. 3E), and in other embodiments, method 400 begins after operation 212 of method 200 (shown in FIG. 3F). FIGS. 5A-5I will depict the latter embodiment. At operation 414, TiN layer 556 and high electrical resistance layer 558 are deposited inside wall 110. More specifically, TiN layer 556 is formed on stack 116, wall 110, and bottom electrode 106, and high electrical resistance layer 558 is formed on TiN layer 556 and can be comprised of, for example, SiN or high resistance TaN. At operation 416, chemical mechanical polishing (CMP) is performed to remove the excess material from TiN layer 556 and high electrical resistance layer 558 to form heater 560, which is coterminous with stack 116. At operation 418, PCM layer 562, TiN layer 564, and SiN layer 566 are formed on stack 116 and heater 560. In some embodiments, PCM layer 562 is about 80 nm thick, TiN layer 564 is about 75 nm thick, and SiN layer 566 is about 220 nm thick. In some embodiments, prior to operation 418, projection liner 568 (shown in phantom as it is not included in the subsequent steps of method 400) is formed on stack 116 and heater 560.

At operation 420, masking and etching are performed to form PCM material 514, top electrode 522, and hard mask 570, which exposes stack 116. In the illustrated embodiment, the lateral widths of PCM material 514 and top electrode 522 are the same, whereas the width of heater 560 is substantially reduced, comparatively (e.g., three to seven times smaller, or about five times smaller). Thereby, PCM cell 500 can be said to have a mushroom configuration wherein an electrical signal (i.e., electrical current) can flow from bottom electrode 104 to top electrode 522 through heater 560 and PCM material 114. In contrast with PCM cell 100, PCM cell 500 has a two-part heater/PCM portion comprised of heater 560 and a separate PCM material 114. However, the memory function can be operated in the same way as that of PCM cell 100, albeit using heater 560 to program PCM material 514 instead of relying on PCM material 514 to heat itself.

At operation 422, encapsulation layer 572 is formed on stack 116, PCM material 514, top electrode 522, and hard mask 570. Encapsulation layer 572 can be comprised of, for example, SiN or silicon carbonitride (SiCN). At operation 424, etching is performed to form encapsulator 574 and cap 576, which exposes insulator 108. At operation 426, insulator 520 and top wire 524 are formed on insulator 108, stack 116, top electrode 522, encapsulator 574, and cap 576, respectively, to complete PCM cell 500.

The components, configuration, and operation of PCM cell 500 and method 400 allow for gaps 118 to be formed around heater 560. This can occur because B layers 130 are susceptible to at least one material removal processes that A layers 128 are resistant to.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory (PCM) cell comprising: a first electrode;
a heater/PCM portion electrically connected to first electrode, the heater/PCM portion comprising a PCM material;
a second electrode electrically connected to the PCM material; and
an electrical insulator stack surrounding at least some of the heater/PCM portion, the stack comprising:
a plurality of first layers comprised of a first material and having a plurality of first inner sides facing towards the heater/PCM portion; and
a plurality of second layers alternating with the plurality of first layers, the plurality of second layers comprised of a second material that is different from the first material, and the second plurality of layers having a plurality of second inner sides facing towards the heater/PCM portion;
wherein the plurality of second inner sides that are offset from the plurality of first inner sides forming a plurality of gaps.

2. The PCM cell of claim 1, further comprising a projection liner that is in direct contact with the first electrode, the second electrode, and the PCM material.

3. The PCM cell of claim 2, further comprising a wall in direct contact with the projection liner and the stack.

4. The PCM cell of claim 3, wherein each of the plurality of gaps is bounded by two of the plurality of first layers, one of the plurality of second layers, and the wall.

5. The PCM cell of claim 3, wherein:
the plurality of first layers is in direct contact with the wall; and
the plurality of second layers is spaced apart from the wall.

6. The PCM cell of claim 3, wherein each gap is further bounded by the wall.

7. The PCM cell of claim 1, wherein:
the first material is resistant to a material removal process; and the second material is susceptible to the material removal process.

8. The PCM cell of claim 1, wherein the heater/PCM portion further comprises a heater that is separate from the PCM material and is comprised of a high electrical resistance material.

9. A method of manufacturing a phase change memory (PCM) cell, the method comprising: forming a first electrode;
forming an electrical insulator stack on the first electrode, wherein the stack comprises: a plurality of first layers comprised of a first material; and
a plurality of second layers alternating with the plurality of first layers, the plurality of second layers comprised of a second material that is different from the first material;
forming a via in the stack;
removing portions of the plurality of second layers from the via while leaving the plurality of first layers intact;
forming a wall in the via on the plurality of first layers, which creates a plurality of gaps; forming a heater/PCM portion inside the wall; and
forming a second electrode on the heater/PCM portion.

10. The method of claim 9, wherein each of the plurality of gaps is bounded by two of the plurality of first layers, one of the plurality of second layers, and the wall.

11. The method of claim 9, further comprising:
forming a projection liner on the first electrode and the wall prior to forming the heater/PCM portion such that the projection liner is positioned between the wall and the heater/PCM portion.

12. The method of claim 9, wherein forming the heater/PCM portion inside the wall comprises depositing a PCM material inside the wall and on the stack.

13. The method of claim 9, wherein forming the heater/PCM portion inside the wall comprises: depositing a high electrical resistance material inside the wall and on the stack to form a
- heater; and
- depositing a PCM material on the heater and on the stack.

14. A phase change
- memory (PCM) cell comprising: a first
- electrode;
- a heater/PCM portion electrically connected to first electrode, the heater/PCM portion comprising a PCM material;
- a second electrode electrically connected to the PCM material; and
- an electrical insulator stack surrounding the a portion of the heater/PCM portion, the stack comprising a plurality of first layers and a plurality of second layers alternating with the plurality of first layers, the stack defining a plurality of gaps, wherein each of the gaps:
  - has a toroidal shape;
  - is axially spaced apart from each other gap;
  - and is bounded by two of the plurality of first layers and one of the plurality of second layers.

15. The PCM cell of claim 14, further comprising a projection liner that is in direct contact with the first electrode, the second electrode, and the PCM material.

16. The PCM cell of claim 15, further comprising a wall in direct contact with the projection liner and the stack.

17. The PCM cell of claim 16, wherein each gap is further bounded by the wall.

18. The PCM cell of claim 17, wherein each gap surrounds a portion of the wall.

19. The PCM cell of claim 14, wherein the heater/PCM portion further comprises a heater that is separate from the PCM material and is comprised of a high electrical resistance material.

* * * * *